(12) United States Patent
Hauer et al.

(10) Patent No.: US 8,004,849 B2
(45) Date of Patent: Aug. 23, 2011

(54) CONTROL UNIT WITH FLEXIBLE CIRCUIT BOARD

(75) Inventors: Gerald Hauer, Deuerling (DE); Josef Loibl, Bad Abbach (DE); Thomas Röhrl, Barbing (DE); Mike Vogel, Regensburg (DE)

(73) Assignee: Siemens VDO Automotive AG, Regensburg (DE)

( * ) Notice: Subject to any disclaimer, the term of this patent is extended or adjusted under 35 U.S.C. 154(b) by 348 days.

(21) Appl. No.: 11/911,970

(22) PCT Filed: Jan. 30, 2006

(86) PCT No.: PCT/EP2006/050505
§ 371 (c)(1),
(2), (4) Date: Oct. 19, 2007

(87) PCT Pub. No.: WO2006/122837
PCT Pub. Date: Nov. 23, 2006

(65) Prior Publication Data
US 2008/0156511 A1    Jul. 3, 2008

(30) Foreign Application Priority Data

May 17, 2005 (DE) .......................... 10 2005 022 536

(51) Int. Cl.
*H05K 1/00* (2006.01)
(52) U.S. Cl. ........................................ 361/749; 361/760
(58) Field of Classification Search .......... 361/760–767, 361/770, 771, 777, 783, 790, 807, 749; 257/684, 257/415, 682, 704, 777, 681, 728–730; 174/52.3, 174/59, 50.51, 50.52
See application file for complete search history.

(56) References Cited

U.S. PATENT DOCUMENTS

| | | | | | |
|---|---|---|---|---|---|
| 5,280,413 | A | * | 1/1994 | Pai | 361/792 |
| 5,825,081 | A | * | 10/1998 | Hosomi et al. | 257/668 |
| 6,195,260 | B1 | * | 2/2001 | Moriyama | 361/749 |
| 6,350,953 | B1 | | 2/2002 | Franzen | |
| 6,573,447 | B2 | * | 6/2003 | Trogisch et al. | 174/565 |
| 6,573,616 | B2 | * | 6/2003 | Yamane | 307/10.1 |
| 7,420,817 | B2 | * | 9/2008 | Eskridge | 361/760 |
| 2002/0050633 | A1 | * | 5/2002 | Matsumoto | 257/685 |
| 2004/0045736 | A1 | * | 3/2004 | Jungbauer et al. | 174/250 |

FOREIGN PATENT DOCUMENTS

| | | |
|---|---|---|
| DE | 195 42 883 A1 | 8/1996 |
| DE | 198 56 839 C2 | 6/2000 |
| DE | 199 29 754 A1 | 1/2001 |
| DE | 100 51 945 C1 | 11/2001 |
| DE | 10051945 C1 * | 11/2001 |
| DE | 100 32 849 A1 | 1/2002 |
| DE | 101 10 620 A1 | 9/2002 |
| EP | 0 972 318 B1 | 1/2000 |
| EP | 1 239 710 A3 | 9/2002 |
| WO | 98/44593 | 10/1998 |
| WO | 0234024 A1 | 4/2002 |

* cited by examiner

*Primary Examiner* — Yuriy Semenenko
(74) *Attorney, Agent, or Firm* — Laurence A. Greenberg; Werner H. Stemer; Ralph E. Locher

(57) ABSTRACT

A control unit for a vehicle component, such as a transmission, is constructed by transferring electronic components from a rigid circuit board to a flexible circuit board. The flexible circuit board is guided through a housing that accommodates the rigid circuit board and a portion of the flexible circuit board. Some electronic components are disposed on the rigid circuit board and some electronic components are disposed on the flexible circuit board.

11 Claims, 3 Drawing Sheets

CONTROL UNIT WITH FLEXIBLE CIRCUIT BOARD

BACKGROUND OF THE INVENTION

Field of the Invention

The present invention relates to a control unit with a flexible circuit board according to the preamble of claim 1.

Automatic transmissions for motor vehicles are primarily electronically controlled. While standalone control devices for mounting in a box affording protection against environmental effects or in the passenger compartment have hitherto been provided for this purpose, the trend toward integration of the control electronics and associated sensor systems into the transmission continues in the direction of mechatronic transmission control. Similar trends for in situ electronics are also prevalent in other areas, such as engine control and braking systems. In order to distribute the signals and currents to the desired locations, flexible circuit boards, among other things, are used.

FIG. 1 shows a plan view of the basic layout of a conventional flexible circuit board of the type used in current volume applications of mechatronic transmission controllers for distributing electrical signals and currents. The flexible circuit board 3 consists of an insulating base film and an insulating cover film made of polyimide, with copper conductors (not shown) sandwiched therebetween. The use of an acrylic adhesive between the layers produces a solid entity. In an inner region of the flexible circuit board 3, a rectangular area is implemented as a recess 33 for the rigid circuit board 5 containing the electronics. In this area, the completely populated and tested rigid circuit board 5 is laminated onto a base plate using thermally conductive adhesive and electrically bonded to the conductive traces 34 of the flexible circuit board 3. Traces 34 lead away from the recess 33. The traces 34 are normally grouped into traces 31 to actuators and sensors and traces 32 to a wiring harness.

A flexible circuit board must withstand exposure to transmission oil over its entire service life. Single layer flexible circuit boards are preferred for cost reasons. Single-part or multipart (rigid-flex solution) flexible circuit boards can be used.

FIG. 2 shows the layout of a conventional transmission controller in plan view. A rigid circuit board 5 is mounted on a base plate 10. A flexible circuit board 3 with traces 34 is connected to the rigid circuit board 5 via wire bonds 9. All the electronic components 7 are disposed on the rigid circuit board 5. A seal 14 in conjunction with a lid 12 shields the rigid circuit board 5 and part of the flexible circuit board 3 from the environment.

The rigid circuit board 5 is produced from a substrate and is based, for example, on a standard circuit board, on low temperature cofired ceramics (LTCC), or on thick film technology. Manufacturing such substrates is very expensive and complex, as they must withstand, among other things, high accelerations up to more than 30 times acceleration due to gravity.

EP 0972 318 B1 also discloses an arrangement for electrically connecting a circuit board to a conductor support. In an overlapping region between the circuit board and the conductor support, the latter is disposed on a base plate and the circuit board is disposed on the conductor support. In the overlapping region, the circuit board is electrically connected to the conductor support by means of an electrically conductive adhesive.

The disadvantage with the existing control units comprising a flexible and a rigid circuit board is that they are complex to manufacture and therefore expensive.

BRIEF SUMMARY OF THE INVENTION

The object of the present invention is therefore to provide a control unit with reduced production costs.

This object is achieved by the measures specified in claim 1. Advantageous embodiments of the invention are set forth in further claims.

The production costs can be reduced by populating the flexible circuit board with electronic components inside the housing. In particular, less material is required for the expensive substrate of the rigid circuit board, as the surface area of the rigid circuit board can be reduced by relocating components from the rigid circuit board to the flexible circuit board.

By disposing the rigid circuit board in a housing and running the flexible circuit board through the housing, the rigid circuit board and part of the flexible circuit board can be protected from chemical and/or mechanical and/or electrical environmental effects.

Disposing components inside the housing is therefore particularly advantageous. In this way, components which would not withstand the conditions outside the protective housing can also be relocated to the flexible circuit board. Such an arrangement provides equipment design flexibility, particularly in terms of the electronics compartment. It also makes it possible to use more advantageous components. Components with a tinned pad coating are suitable for soldered connections, while AgPd coating is suitable for conductive silver adhesives for mounting on the substrate.

Variants can be easily created by partially populating the flexible circuit board, particularly if space is provided on the flexible circuit board for a plurality of components which are only inserted for specific variants. A major advantage is achieved in that no expensive substrate real estate needs to be reserved in the case of less populated variants, thereby enabling a uniform substrate to be used. This also reduces the development time when a substrate with a fixed component configuration is used and variants are provided in the circuit portions on the flexible circuit board, as the setup time of a modified layout of the flexible circuit board is very short.

Packaged and unpackaged components such as Hall sensors for engine speed measurement can be used inside or outside the housing on the flexible circuit board. Although expensive individually packaged sensors are therefore no longer necessary, they can easily be incorporated into the mechatronic control system.

The thermal connection of critical circuit sections or critical components (e.g. output stages or voltage regulators) can be improved.

The following advantages may additionally be provided:

Not all components are equally suitable for relocation to the flexible circuit board. It is basically functional blocks which produce as few as possible additional wire bonds between the rigid and the flexible circuit board that are suitable. In addition, the traces of rigid circuit boards may be designed in smaller dimensions than the traces of flexible circuit boards. It therefore tends to be easier to relocate components with leads that are not too closely adjacent and not overly numerous to the flexible circuit board, as there is a limit to how closely the traces can be adjacent to one another on the flexible circuit board.

In addition, the rigid circuit board is in practice mainly mounted on a base plate with high thermal conductivity, e.g. on an aluminum plate, thereby likewise ensuring good heat dissipation.

Because of the above considerations, it is therefore particularly advantageous for capacitors, transistors, resistors, sensors, Hall sensors and voltage regulators to be relocated to the flexible circuit board.

It may be advantageous for components such as Hall sensors for engine speed measurement to be installed outside the housing.

Particularly when the control unit is deployed in a mechanically and chemically stressed environment such as in a vehicle transmission, the electronics can be protected from destruction with the aid of an oil-tight housing through which the flexible circuit board is run.

A flexible circuit board with an insulating base layer and an insulating cover layer with recesses on which components are disposed is particularly easy to manufacture and install. The insulating layers mean that no further insulation is necessary and components can be soldered, welded or bonded into the recesses.

Flexible circuit boards with only one trace layer are particularly easy and inexpensive to manufacture. Flexible circuit boards with a plurality of trace layers, on the other hand, have the advantage that more complex and more highly integrated circuits can be disposed thereon.

Due to the relocation of components, in some cases additional traces are necessary on the flexible circuit board. In order to perform deconcentration of circuit sections, trace crossovers on the flexible circuit board can be bridged by means of wire bonds.

The flexible circuit board can also consist of a plurality of interconnected flexible sub-boards. A multi-part circuit board is easier to install. In addition, such a multi-part circuit board has the advantage that a basic configuration can be expanded using variants, it being possible for additional components of a variant to be accommodated on a sub-board. Expansion of the basic configuration in this case only requires the installation of the appropriate sub-board.

The invention will now be explained in greater detail using examples with reference to the accompanying drawings in which:

DESCRIPTION OF THE INVENTION

Figure 1:
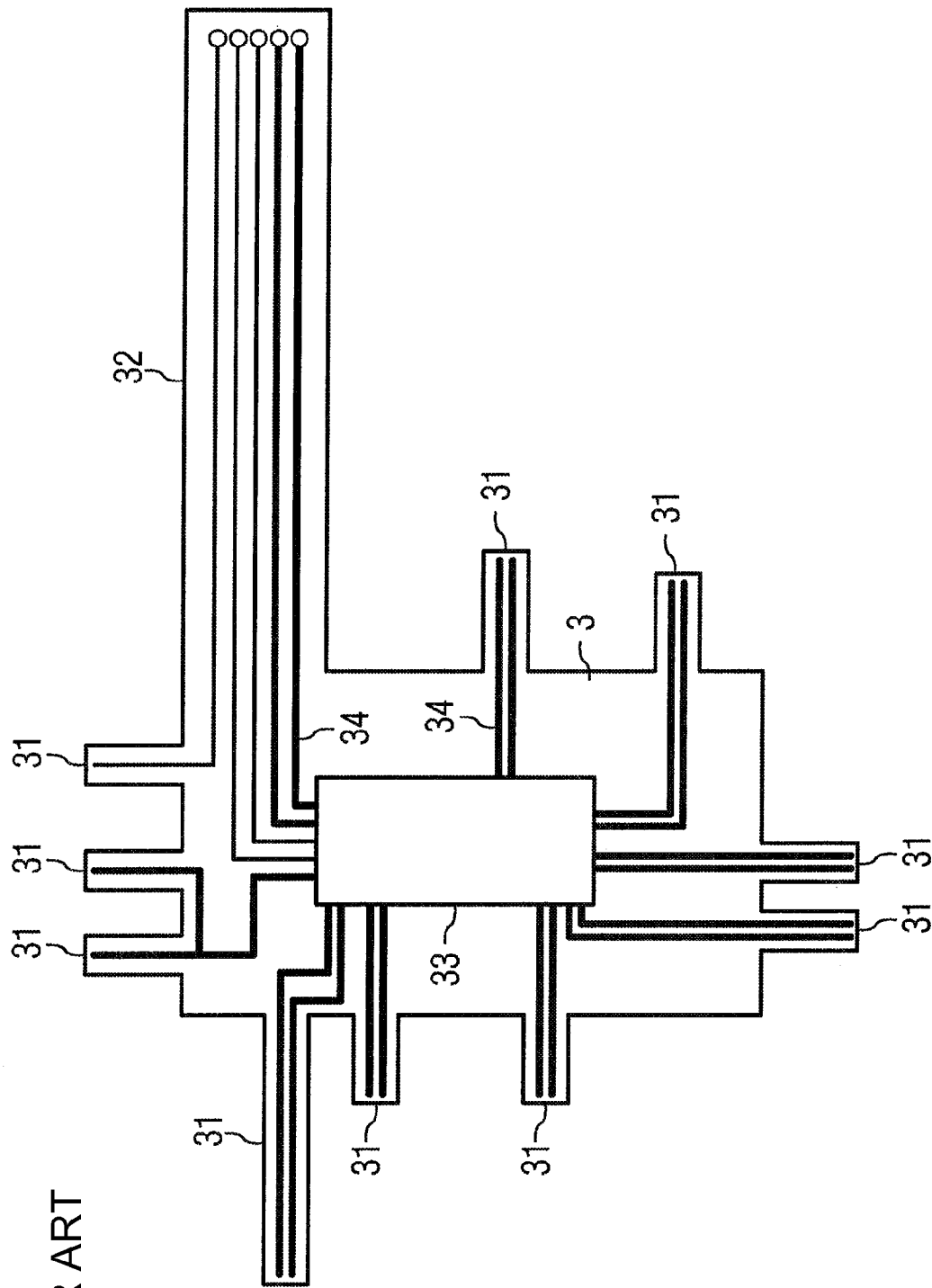
FIG. 1 shows the layout of a conventional flexible circuit board in plan view.
Figure 2:
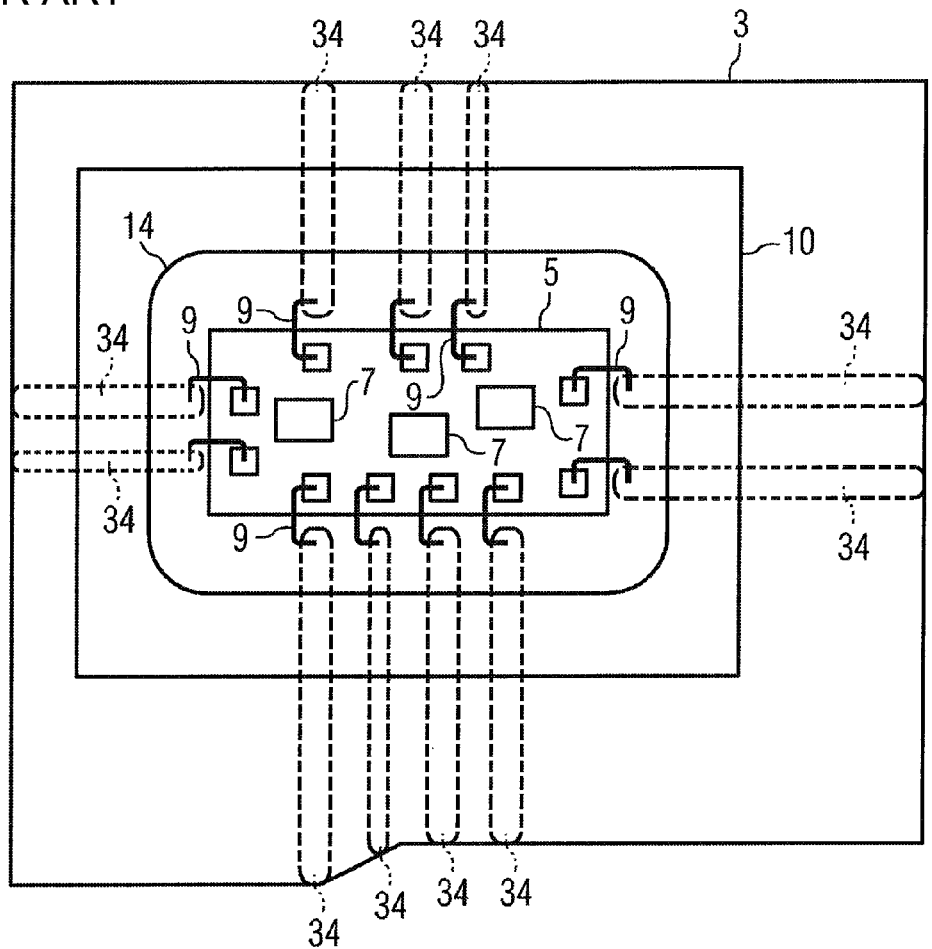
FIG. 2 shows the layout of a conventional transmission controller in plan view without a lid being placed thereon so that internal features can be seen.
Figure 3:
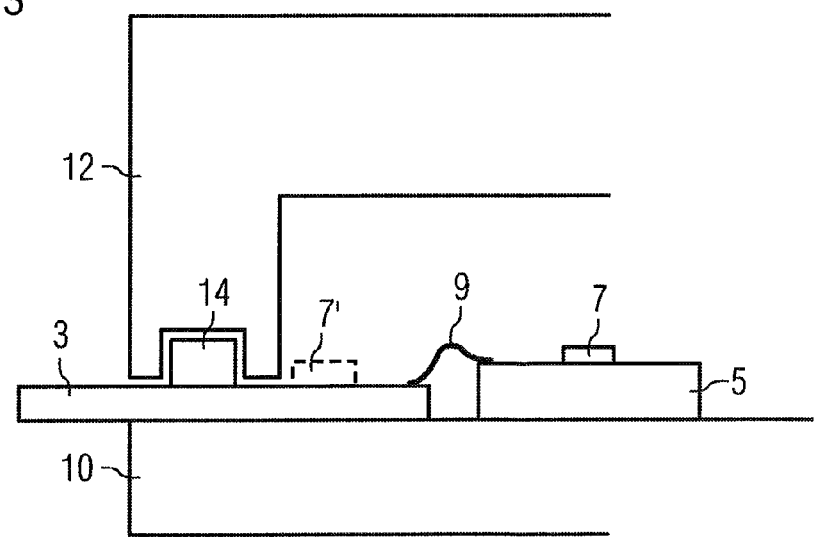
FIG. 3 shows a juxtaposition of a conventional transmission control circuit with a first embodiment of the invention, in side elevation.

FIG. 3 shows a juxtaposition of a conventional control unit with a first embodiment of the invention, in side elevation. The flexible circuit board 3 is connected to a rigid circuit board 5 via wire bonds 9. The rigid circuit board 5 is laminated onto an aluminum base plate extending beyond the rigid circuit board 5 using electrically insulating thermally conductive adhesive. The flexible circuit board 3 is likewise tightly laminated onto said extension of the base plate 10. By means of a seal 14, a lid 12 enclosing the rigid circuit board 5 is permanently connected to the base plate onto which the flexible circuit board is laminated, e.g. by means of rivets or screws, so that a leak-proof housing is formed by the base plate 10 and the lid 12.

According to the prior art, the rigid circuit board 5 is populated with all the electrical components 7. In a first embodiment of the invention, a component 7' is soldered onto the flexible circuit board inside the housing.

Figure 4:
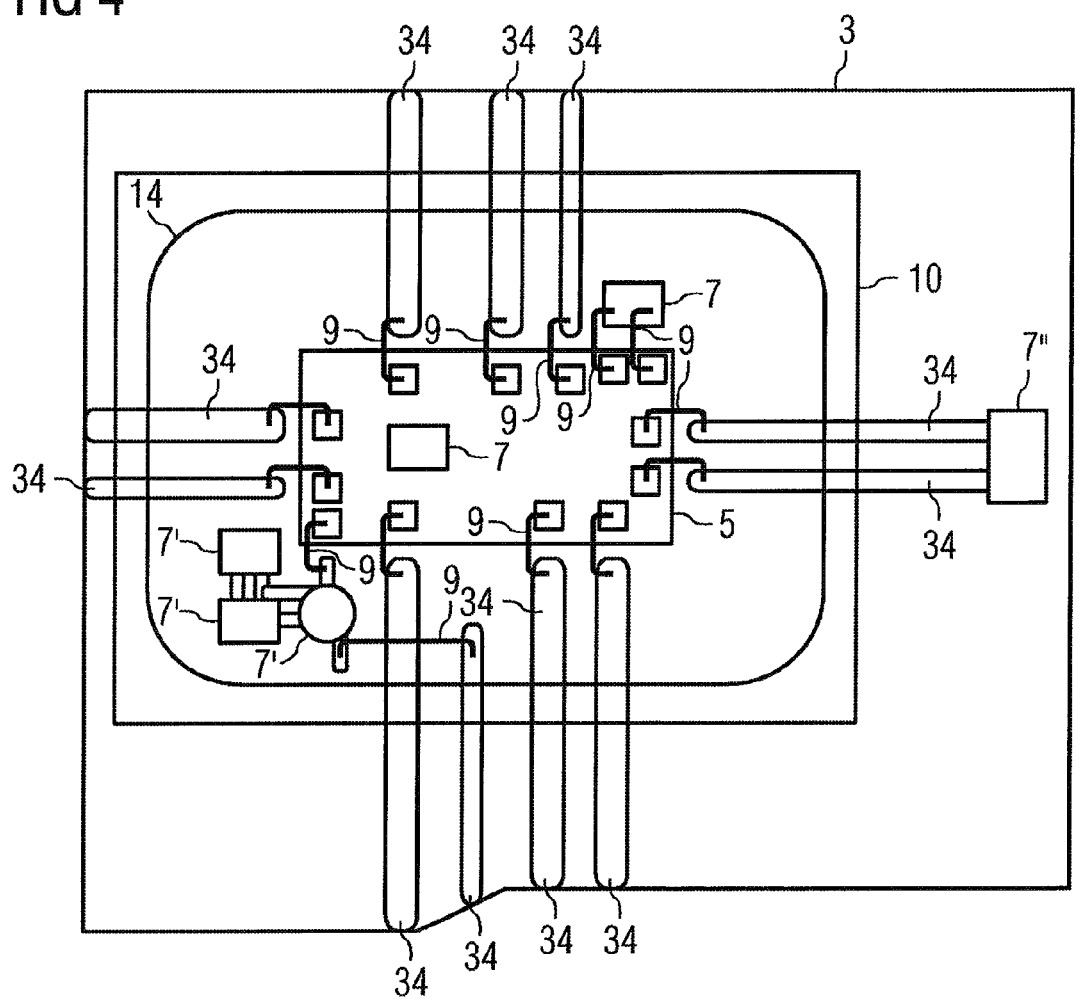
FIG. 4 shows a control unit in another embodiment of the invention in plan view without a lid being placed thereon so that internal features can be seen.

FIG. 4 shows the control unit 1 with a rigid 5 and a flexible 3 circuit board in another embodiment of the invention. The rigid circuit board 5 is mounted on a base plate 10. The flexible circuit board 3 with traces 34 is connected to the rigid circuit board 5 via bond wires 9. Electronic components 7, 7', 7" are disposed not only on the rigid circuit board 5 but also on the flexible circuit board 3. The flexible circuit board 3 is run through an oil-tight housing by means of a seal 14. Electronic components 7', 7" such as capacitors, transistors, resistors, voltage regulators and sensors are disposed on the flexible circuit board 3 inside and outside the oil-tight housing. The flexible circuit board 3 has traces 34 which are connected to the rigid circuit board 5 by means of wire bonds 9 and/or to which the components 7', 7" disposed on the flexible circuit board 3 are connected. Bond wires 9 are likewise provided in order to bridge traces 34 of the flexible circuit board 3.

The invention claimed is:

1. A control unit for a vehicle component, comprising:
    a housing;
    a flexible circuit board;
    a rigid circuit board having first electronic components, said rigid circuit board electrically connected to said flexible circuit board, said rigid circuit board and a part of said flexible circuit board disposed in said housing and said flexible circuit board running through said housing; and
    at least one sensor disposed outside of said housing and on said flexible circuit board;
    said flexible circuit board having second electronic components disposed inside said housing; and
    said first electronic components of said rigid circuit board disposed inside said housing;
    wherein said rigid circuit board does not extend to said sensor disposed on said flexible circuit board, wherein said sensor disposed outside of said housing and on said flexible circuit board is a Hall sensor.

2. The control unit according to claim 1, wherein said flexible circuit board has third electronic components disposed outside of said housing.

3. The control unit according to claim 2, wherein said second and third electronic components have at least one component selected from the group consisting of capacitors, transistors, resistors, voltage regulators, sensors and Hall sensors.

4. The control unit according to claim 1, wherein said housing is an oil-tight housing and said flexible circuit board runs through said housing in an oil-tight manner.

5. The control unit according to claim 2, wherein said flexible circuit board has an insulating base layer and an insulating cover layer, said insulating cover layer having recesses formed therein on which said second and third electronic components are disposed.

6. The control unit according to claim 1, wherein said flexible circuit board has a single trace layer.

7. The control unit according to claim 1, wherein said flexible circuit board has a plurality of traces.

8. The control unit according to claim 7, further comprising a wire bond electrically connecting at least one of said plurality of traces on said flexible circuit board to said rigid circuit board.

9. The control unit according to claim 1, wherein said flexible circuit board is a multi-part flexible circuit board.

10. The control unit according to claim 1, wherein the control unit is a control unit for motor vehicle transmission.

11. The control unit according to claim 1, wherein said second electronic components include a voltage regulator.

* * * * *